United States Patent
Jurisch

(10) Patent No.: US 6,448,780 B1
(45) Date of Patent: Sep. 10, 2002

(54) METHOD OF CALCULATING A RESISTANCE

(75) Inventor: Andreas Jurisch, Berlin (DE)

(73) Assignee: Siemens AG, Munich (DE)

( * ) Notice: Subject to any disclaimer, the term of this patent is extended or adjusted under 35 U.S.C. 154(b) by 0 days.

(21) Appl. No.: 09/117,592
(22) PCT Filed: Jan. 24, 1997
(86) PCT No.: PCT/DE97/00159
§ 371 (c)(1), (2), (4) Date: Feb. 16, 1999
(87) PCT Pub. No.: WO97/28452
PCT Pub. Date: Aug. 7, 1997

(30) Foreign Application Priority Data

Jan. 31, 1996 (DE) .......................... 196 05 013

(51) Int. Cl.$^7$ ................................ G01R 31/08
(52) U.S. Cl. ........................ 324/525; 324/522
(58) Field of Search ................ 324/522, 525, 324/524, 523, 521, 509

(56) References Cited

U.S. PATENT DOCUMENTS

| | | | |
|---|---|---|---|
| 3,984,737 A | | 10/1976 | Okamura et al. |
| 4,559,491 A | * | 12/1985 | Saha .......................... 324/522 |
| 4,758,962 A | * | 7/1988 | Fernades .................... 324/127 |
| 4,906,937 A | * | 3/1990 | Wikstrom et al. .......... 324/522 |
| 5,506,789 A | * | 4/1996 | Russell et al. .............. 324/534 |

FOREIGN PATENT DOCUMENTS

| | | |
|---|---|---|
| DE | 25 51 472 | 5/1977 |
| EP | 02 84 546 | 9/1988 |

OTHER PUBLICATIONS

Glover et al, 1994, PWS Publishing Company, Second Edition, pp. 15–20.*
Taschenbuch Elektrotechnik (including English Translation), Handbook of Electrical Engineering, Edited by Professor E. Philippow; Technical University of Ilmenaw, Berlin, pp. 105–116, vol. I.

* cited by examiner

Primary Examiner—Michael Sherry
Assistant Examiner—Jermele M. Hollington
(74) Attorney, Agent, or Firm—Kenyon & Kenyon

(57) ABSTRACT

A method of determining the resistance of a conductive loop formed by a fault in a monitored section of a power-supply line through which a.c. current is flowing. Instantaneous values of the current and voltage are measured over a given period of time. The instantaneous values of the current and the voltage are measured over a half-period of the a.c. current. Instantaneous power values of the current are integrated to give a value proportional to the effective power. The instantaneous values determined for the current are squared and the integral of the square of the current determined. The resistance is determined by dividing the value proportional to the effective power by the integral of the square of the current.

1 Claim, 2 Drawing Sheets

```
┌─────────────────────────────────────┐
│ DETERMINE P(tn) WHICH IS PROPORTIONAL│
│ TO THE EFFECTIVE POWER, FROM SECONDARY│──20
│ INSTANTANEOUS VALUES IS(tn) OF CURRENT I(t)│
│ SAMPLED AT CURRENT TRANSFORMER 3     │
│ AND FROM SECONDARY INSTANTANEOUS     │
│ VALUES US(tn) OF VOLTAGE U(t) SAMPLED│
│ AT VOLTAGE TRANSFORMER 4             │
└─────────────────────────────────────┘
                  │
                  │
┌─────────────────────────────────────┐
│ SQUARE AND ADD UP INSTANTANEOUS VALUES│
│ OF THE SECONDARY CURRENT MEASURED IN │──21
│ THE SAME INTERVAL tn-9 THROUGH tn    │
└─────────────────────────────────────┘
                  │
                  │
┌─────────────────────────────────────┐
│ CALCULATE THE RESISTANCE VALUE AT TIME│
│ tn BY TAKING THE QUOTIENT OF THE VALUE│──22
│ PROPORTIONAL TO THE EFFECTIVE POWER  │
│ AND THE SUM OF THE SQUARED CURRENTS  │
└─────────────────────────────────────┘
```

FIG. 2

METHOD OF CALCULATING A RESISTANCE

FIELD OF THE INVENTION

The present invention relates to a method of calculating the resistance value of an impedance of a conductive loop formed by a fault in a monitored section of an electric power supply line through which an a.c. current is flowing, using instantaneous values of the measured current and the measured voltage sampled in an interval of time.

BACKGROUND INFORMATION

European Patent No. 0 284,546 describes a method of calculating a resistance. In this method, instantaneous values of the current and the voltage are sampled and weighted in a digital filter unit composed of multiple linear-phase non-recursive digital FIR filters of a first type and a second type. The weighted instantaneous values are used in first-order differential equations. These differential equations are then used to form a resistance value. European Patent No. 0 284,546 further describes that with a sampling period of 1 ms and for alternating current with a period of oscillation of 20 ms, a total of 13 instantaneous values of the current and/or the corresponding voltage must be weighted for a rapid and sufficiently accurate determination of the resistance value (page 4, lines 7 through 11, and page 9, lines 45 through 47). This number of instantaneous values is obtained from a selected counter degree of n=8 and from an interval of approximately ¼ the system period (5 ms) which is to be maintained in sampling linearly independent instantaneous values. Thus, sampling the instantaneous values requires 13 ms.

SUMMARY OF THE INVENTION

An object of the present invention is to reduce the time required to form the resistance value the type in comparison with the conventional method, without thereby becoming much more inaccurate.

This object is achieved according to the present invention by providing a method including the steps of:

- detecting instantaneous values of the current and voltage sampled during half a period of the a.c. current,
- calculating instantaneous values of the power from the instantaneous values detected for the current and voltage, and determining from them a value proportional to the effective power by integration,
- squaring the instantaneous values of the current thus determined and determining an integral of the squared instantaneous value of the current, and
- generating the resistance value from the value proportional to the effective power and the value of the integral of the squared instantaneous values of the current by forming a quotient.

Unexamined German Patent Application No. 25 51 472 describes a device for testing resistance welding equipment. A resistance value is obtained by calculating the quotient of an intermediate measured quantity proportional to the effective power and another intermediate measured quantity proportional to the effective current value. However, this value gives the resistance value of a welding cable of the resistance welding equipment. The current through the welding cable and the voltage drop on this cable are detected and processed further as analog (sinusoidal) values. After integration, the current is sent first to a squaring element with a downstream integrator and also, together with the voltage drop, sent to a multiplier with a downstream integrator circuit. At the output of the integrator circuit, an intermediate measured quantity is obtained, while the additional intermediate measured quantity is obtained at the output of the integrator. Because of the processing of analog values, this conventional device requires a measurement time of at least one period of the current through the welding cable to form the resistance value.

An important advantage of the method according to the present invention is that for mathematical reasons, to determine the resistance values, it is sufficient to determine the instantaneous values during only half a period of the a.c. oscillation, i.e., with an oscillation period of 20 ms, only 10 ms are needed to detect the instantaneous values. The method according to the present invention makes use of the property of the alternating current whereby the current and the corresponding voltage can be described with the following sine functions:

$$I(t)=\sqrt{2} \cdot I \sin(\omega t+\psi)$$

$$U(t)=\sqrt{2} \cdot U \sin(\omega t).$$

where I and U here are the effective current and voltage values, $\omega$ is the angular frequency of the system oscillation, and $\phi$ is the phase difference between I(t) and U(t).

The product of the current times voltage yields the following equation:

$$I(t) \cdot U(t) = \sqrt{2} \cdot I \sin(\omega t+t) \cdot \sqrt{2} U \sin(\psi t)$$

After converting, this yields $$I(t) \cdot U(t) = UI \cos\psi - UI \cos(2\omega t + \psi).$$

The right side of this equation has a cosine with twice the system oscillation frequency $2\omega$. The above-mentioned advantage derives from the fact that in integration of the product I(t)·U(t) over a period $T_{2\omega}$, which corresponds to half a system oscillation period, the values of the cosine with twice the system oscillation frequency add up to zero. The following value which is proportional to the effective power $P=UI\cos\phi$ is obtained:

$$\int_{T_{2\omega}} U(t) \cdot I(t) \, dt = \frac{\pi}{\omega} U I \cos\varphi \qquad (1)$$

On the other hand, effective power P can also be calculated with the following equation in a known way:

$$P = I^2 R,$$

where R is the resistance value.

The square of the instantaneous values of the current is needed for the calculation. To do so, integration of squared instantaneous current values over the period $T_{2\omega}$ is calculated in the following equation:

$$\int_{T_{2\omega}} I^2(t) \, dt = 2I^2 \int_{T_{2\omega}} \sin^2(\omega t + \varphi) \, dt \qquad (2)$$

$$= \frac{\pi}{\omega} I^2$$

It follows that resistance value R can be determined from the values of equations (1) and (2):

$$R = \frac{\int_{T_{2\omega}} U(t) \cdot I(t) \, dt}{\int_{T_{2\omega}} I^2(t) \, dt} \quad (3)$$

$$= \frac{UI\cos\varphi}{I^2}$$

BRIEF DESCRIPTION OF THE DRAWINGS

FIG. 2 shows a block diagram of an embodiment of the arrangement according to FIG. 1 for carrying out the method according to the present invention.

DETAILED DESCRIPTION

Figure 1:
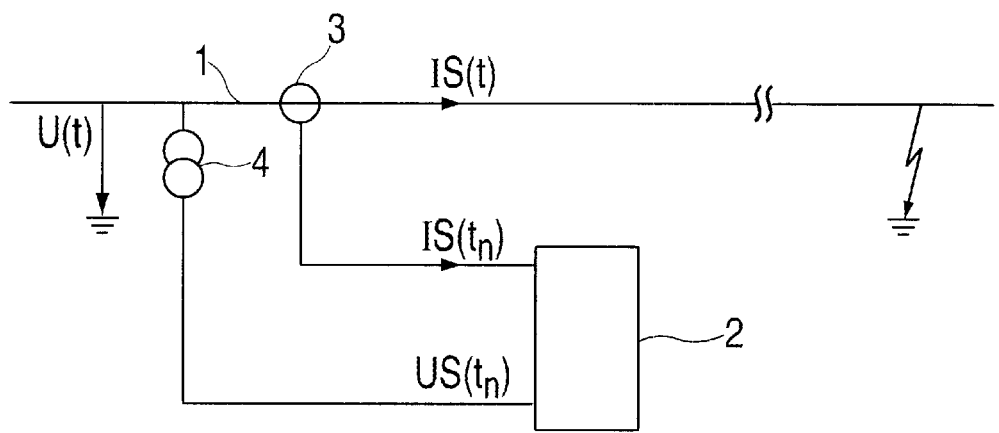
FIG. 1 shows a schematic diagram of a conductive loop including an arrangement for carrying out the method according to the present invention.

FIG. 1 shows a schematic diagram of a conductive loop in the form of an electric line 1 through which flows an a.c. current that is subject to a short circuit to ground, with an arrangement 2 for carrying out the method according to the present invention.

FIG. 2 shows a block diagram of an embodiment of the arrangement 2 according to FIG. 1 for carrying out the method according to the present invention.

Taking into account the fundamental relationship (3), first, as shown in block 20 of FIG. 2, the value $P(t_n)$ which is proportional to the effective power is determined from secondary instantaneous values $IS(t_n)$ of current $I(t)$ sampled at current transformer 3 and from secondary instantaneous values $US(t_n)$ of voltage $U(t)$ sampled at voltage transformer 4, as shown in the following equation:

$$P(t_n) = \sum_{k=0}^{9} US(t_{n-k}) \cdot IS(t_{n-k})$$

In this equation, the value proportional to the effective power at time $t_n$ stands on the left side. The product of the instantaneous value of the secondary voltage times the instantaneous value of the secondary current, both sampled at time $t_{n-k}$, over values of k is added up on the right side of the equation. The sum contains all the instantaneous values measured between $t_{n-9}$ and $t_n$, and it corresponds to integration over half a period of the system oscillation when ten samplings are performed per half period.

Then, as shown in block 21 of FIG. 2, instantaneous values of the secondary current measured in the same interval $t_{n-9}$ through $t_n$ are squared and added up:

$$I_\Sigma^2(t_n) = \sum_{k=0}^{9} IS^2(t_{n-k})$$

Time $t_n$ on the left side indicates that the sum thus determined is a value for obtaining the resistance value at time $t_n$.

As shown in block 22 of FIG. 2, the resistance value is calculated by taking the quotient of the value proportional to the effective power and the sum of the squared currents as follows:

$$R(t_n) = \frac{P(t_n)}{I_\Sigma^2(t_n)}$$

The method according to the present invention can be used to advantage in an impedance protection method. For example, it is suitable for performing a relatively rapid determination of the resistance component of an impedance so that this resistance component and optionally another relatively rapidly determined component of the impedance can be checked to determine whether they are within an operating characteristic. This operating characteristic may be, for example, a circle cut symmetrically and parallel to a reactance axis.

What is claimed is:

1. A method of determining a resistance of an impedance of a conductive loop, the conductive loop being formed by a fault on a monitored section of an electric power supply system through which an alternating current flows, comprising the steps of:

sampling instantaneous current values and instantaneous voltage values on the conductive loop over a half of a period of the alternating current;

multiplying the instantaneous current values and the instantaneous voltage values together to determine instantaneous power values;

integrating the instantaneous power values to form a proportional power value, the proportional power value being proportional to an effective power on the conductive loop;

squaring the instantaneous current values and integrating the squared instantaneous current values to form an integral current value; and determining the resistance of the impedance of the conductive loop by forming a quotient of the proportional power value and the integral current value.

* * * * *